(12) United States Patent
Sung et al.

(10) Patent No.: US 11,948,795 B2
(45) Date of Patent: Apr. 2, 2024

(54) METHOD FOR MANUFACTURING SINGLE-CRYSTAL SEMICONDUCTOR LAYER, STRUCTURE COMPRISING SINGLE-CRYSTAL SEMICONDUCTOR LAYER, AND SEMICONDUCTOR DEVICE COMPRISING STRUCTURE

(71) Applicant: IUCF-HYU (INDUSTRY-UNIVERSITY COOPERATION FOUNDATION HANYANG UNIVERSITY), Seoul (KR)

(72) Inventors: Myung Mo Sung, Seoul (KR); Lynn Lee, Gyeonggi-do (KR); Jin Won Jung, Seoul (KR); Jong Chan Kim, Paju-si (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 734 days.

(21) Appl. No.: 17/052,889

(22) PCT Filed: Dec. 9, 2019

(86) PCT No.: PCT/KR2019/017268
§ 371 (c)(1),
(2) Date: Nov. 4, 2020

(87) PCT Pub. No.: WO2020/122516
PCT Pub. Date: Jun. 18, 2020

(65) Prior Publication Data
US 2021/0242012 A1    Aug. 5, 2021

(30) Foreign Application Priority Data

Dec. 10, 2018 (KR) .................... 10-2018-0158550
Dec. 5, 2019 (KR) .................... 10-2019-0160511

(51) Int. Cl.
*H01L 21/02* (2006.01)
*C23C 16/40* (2006.01)
(Continued)

(52) U.S. Cl.
CPC ........ *H01L 21/0262* (2013.01); *C23C 16/407* (2013.01); *C23C 16/45525* (2013.01);
(Continued)

(58) Field of Classification Search
CPC ............. H01L 21/0262; H01L 21/0242; H01L 21/02433; H01L 21/0254; H01L 21/02554;
(Continued)

(56) References Cited

U.S. PATENT DOCUMENTS

2003/0207589 A1* 11/2003 Li .................... C30B 25/18
438/785
2011/0156026 A1* 6/2011 Yamazaki ........ H01L 21/02631
257/43
(Continued)

FOREIGN PATENT DOCUMENTS

KR    10-2004-0108771 A    12/2004
KR       10-0811281 B1     3/2008
(Continued)

OTHER PUBLICATIONS

International Search Report for PCT/KR2019/017268, dated Mar. 20, 2020.

*Primary Examiner* — Shaun M Campbell
(74) *Attorney, Agent, or Firm* — Sughrue Mion, PLLC

(57) ABSTRACT

Provided are a method for manufacturing a single-crystal semiconductor layer. The method of manufacturing the
(Continued)

single crystalline semiconductor layer includes performing a unit cycle multiple times, wherein the unit cycle includes a metal precursor pressurized dosing operation in which a metal precursor is adsorbed on a surface of a single crystalline substrate by supplying the metal precursor onto the single crystalline substrate while an outlet of a chamber in which the single crystalline substrate is loaded is closed such that a reaction pressure in the chamber is increased; a metal precursor purge operation; a reactive gas supplying operation in which a reactive gas is supplied into the chamber to cause a reaction of the reactive gas with the metal precursor adsorbed on the single crystalline substrate after the metal precursor purge operation; and a reactive gas purge operation.

15 Claims, 10 Drawing Sheets

(51) Int. Cl.

| | | |
|---|---|---|
| *C23C 16/455* | (2006.01) | |
| *C30B 25/02* | (2006.01) | |
| *C30B 29/16* | (2006.01) | |
| *H01L 21/30* | (2006.01) | |
| *H01L 29/04* | (2006.01) | |
| *H01L 29/20* | (2006.01) | |
| *H01L 29/22* | (2006.01) | |
| *H01L 29/786* | (2006.01) | |
| *H01L 33/12* | (2010.01) | |
| *H01L 33/16* | (2010.01) | |
| *H01L 33/28* | (2010.01) | |
| *H01L 33/32* | (2010.01) | |

(52) U.S. Cl.
CPC .............. *C30B 25/02* (2013.01); *C30B 29/16* (2013.01); *H01L 21/0242* (2013.01); *H01L 21/02433* (2013.01); *H01L 21/0254* (2013.01); *H01L 21/02554* (2013.01); *H01L 21/02609* (2013.01); *H01L 21/30* (2013.01); *H01L 29/045* (2013.01); *H01L 29/2003* (2013.01); *H01L 29/22* (2013.01); *H01L 29/78696* (2013.01); *H01L 33/12* (2013.01); *H01L 33/16* (2013.01); *H01L 33/28* (2013.01); *H01L 33/32* (2013.01)

(58) Field of Classification Search
CPC .............. H01L 21/02609; H01L 21/30; H01L 29/045; H01L 29/2003; H01L 29/22; H01L 29/78696; H01L 33/12; H01L 33/16; H01L 33/28; H01L 33/32; C23C 16/407; C23C 16/45525; C30B 25/02; C30B 29/16
See application file for complete search history.

(56) References Cited

U.S. PATENT DOCUMENTS

2013/0009196 A1* 1/2013 Iwanaga ............... H01L 33/382
257/E33.062
2019/0062917 A1* 2/2019 Sung ................ C23C 16/45527

FOREIGN PATENT DOCUMENTS

| | | |
|---|---|---|
| KR | 10-2008-0064259 A | 7/2008 |
| KR | 10-2015-0122433 A | 11/2015 |
| KR | 10-2017-0123752 A | 11/2017 |
| WO | 2003/094218 A3 | 11/2003 |
| WO | 2017/188785 A1 | 11/2017 |

* cited by examiner

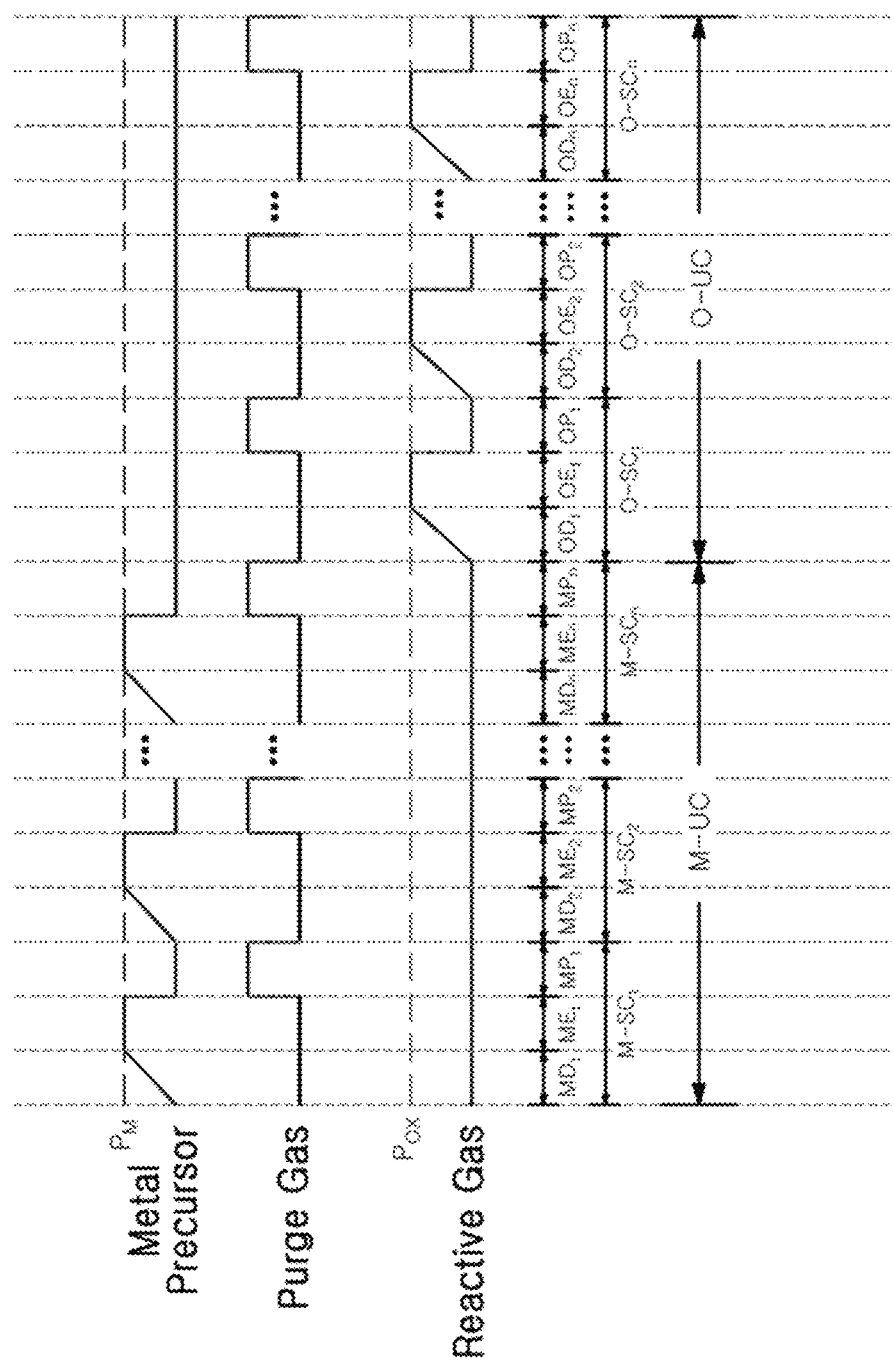
[FIG. 1A]

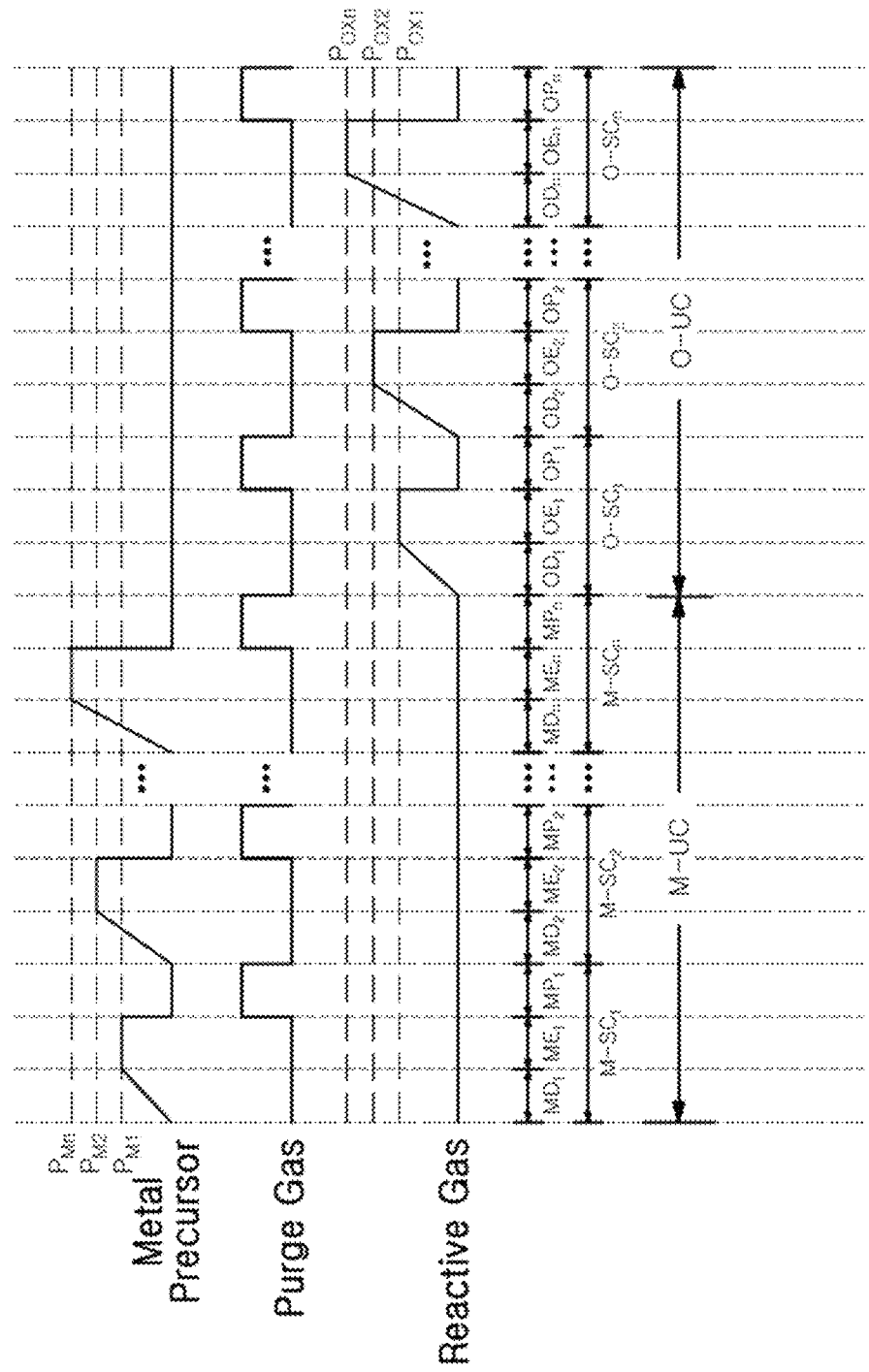
[FIG. 1B]

[FIG. 2]
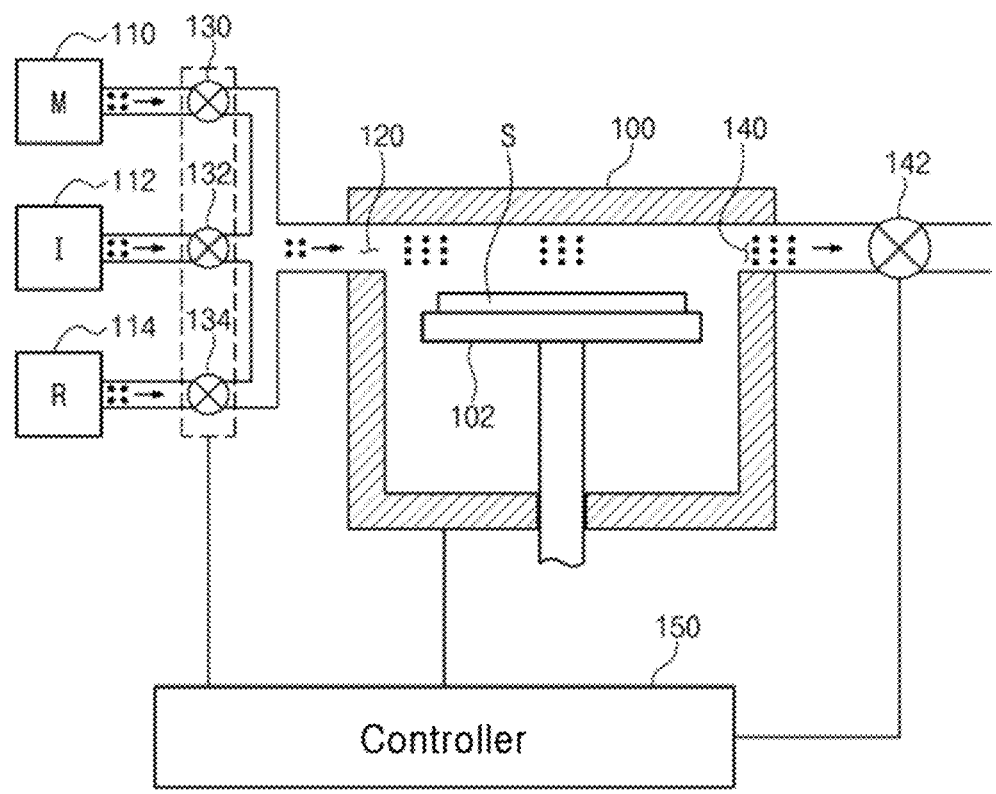
[FIG. 3]
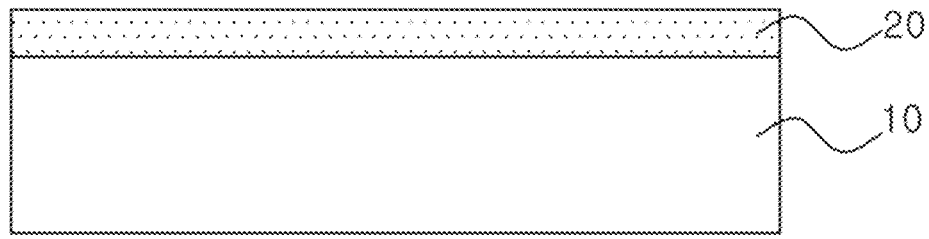

[FIG. 4]
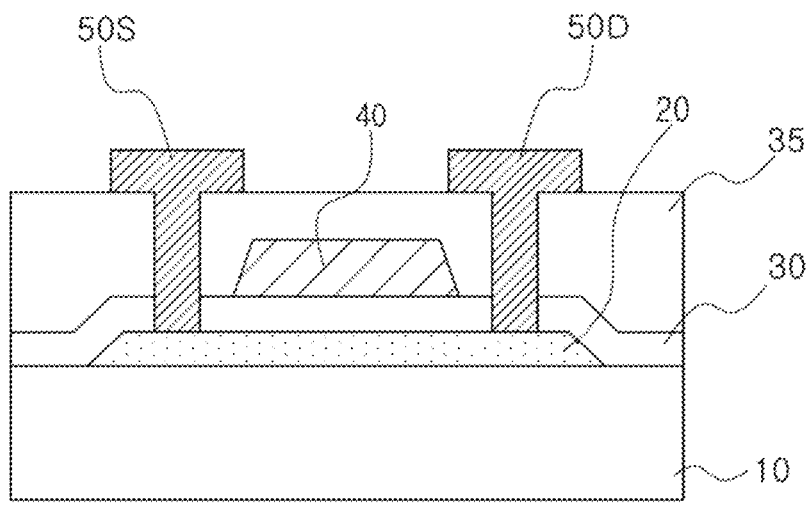
[FIG. 5]
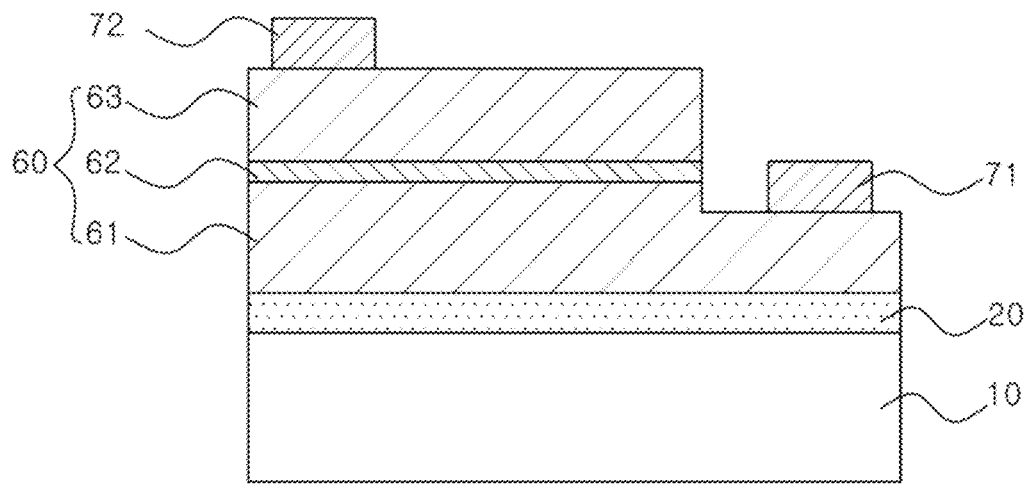
[FIG. 6]
| DEZ | P | DEZ | P | DEZ | P | DEZ | P |
|---|---|---|---|---|---|---|---|
| 3s | 15s | 3s | 15s | 3s | 15s | 3s | 15s |
| 1 Torr | | 1 Torr | | 1 Torr | | 1 Torr | |
| H₂O | P | H₂O | P | H₂O | P | H₂O | P |
| 3s | 25s | 3s | 25s | 3s | 25s | 3s | 25s |
| 1 Torr | | 1 Torr | | 1 Torr | | 1 Torr | |

[FIG. 7A]
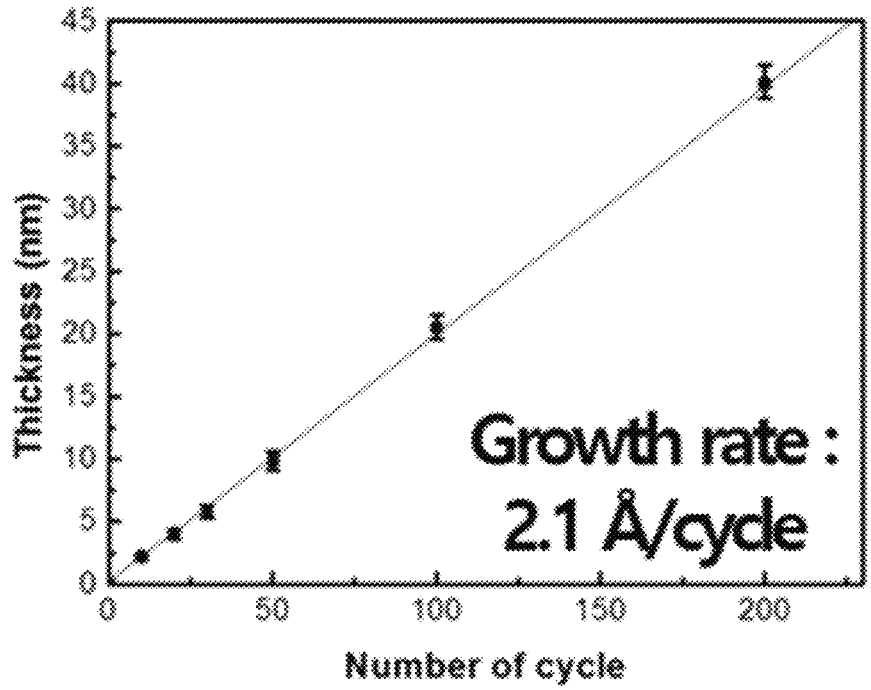
[FIG. 7B]
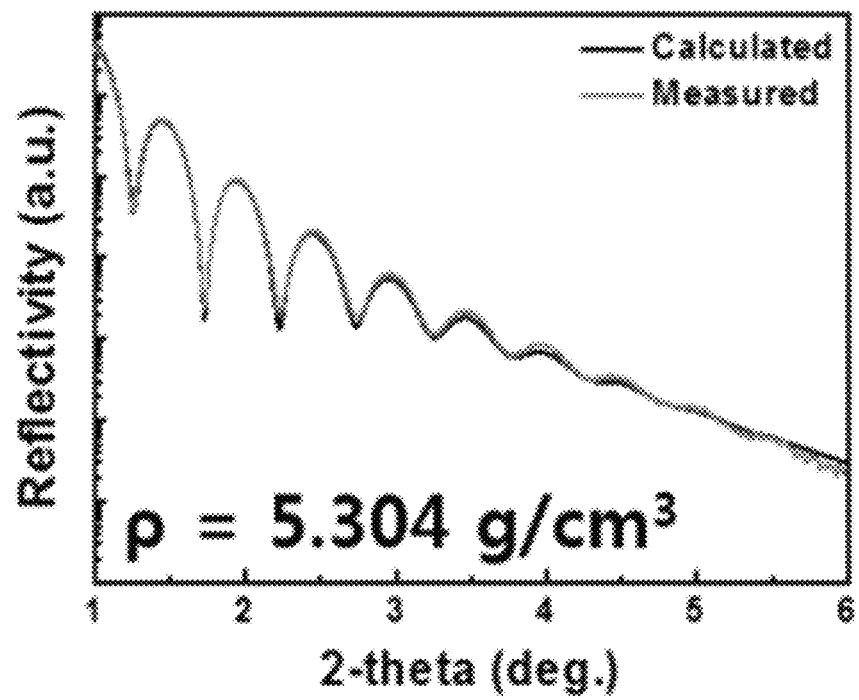

[FIG. 7C]
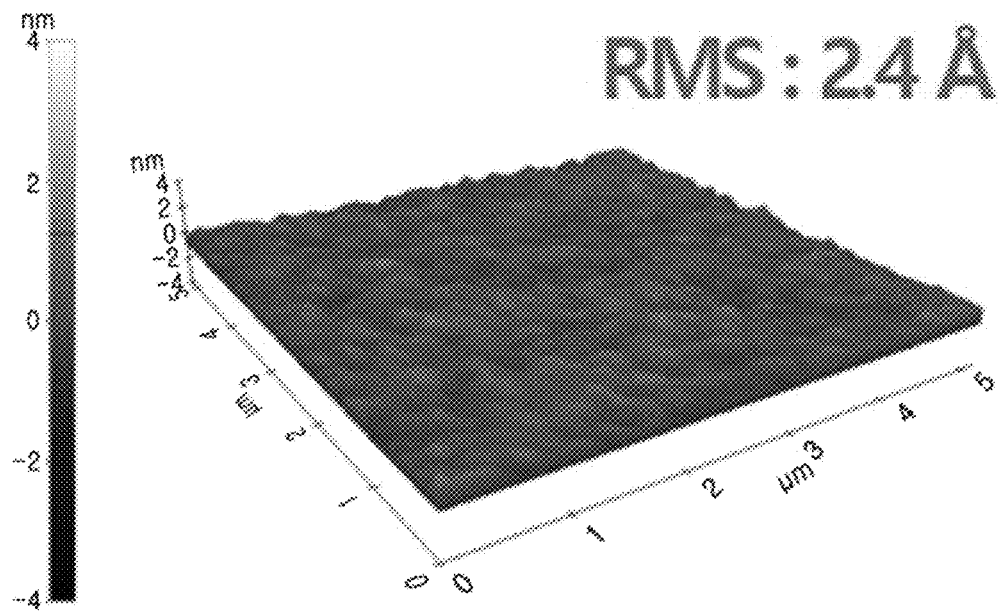
[FIG. 8A]
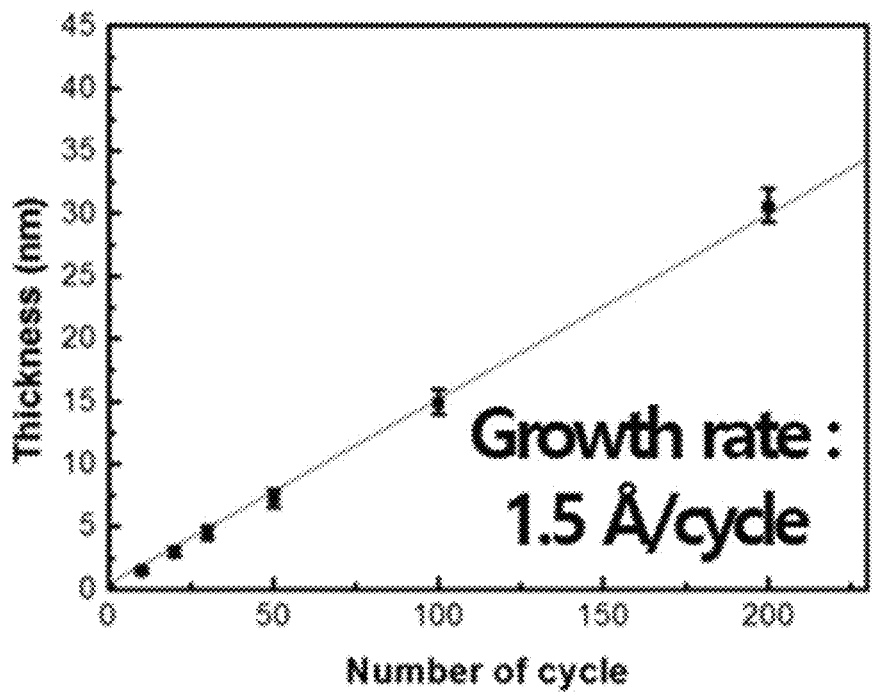

[FIG. 8B]
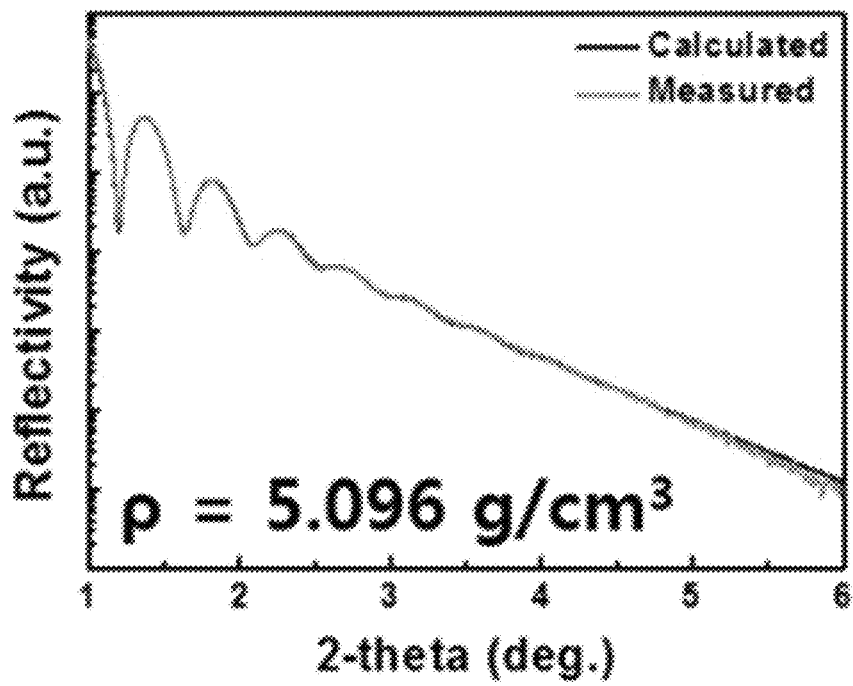
[FIG. 8C]
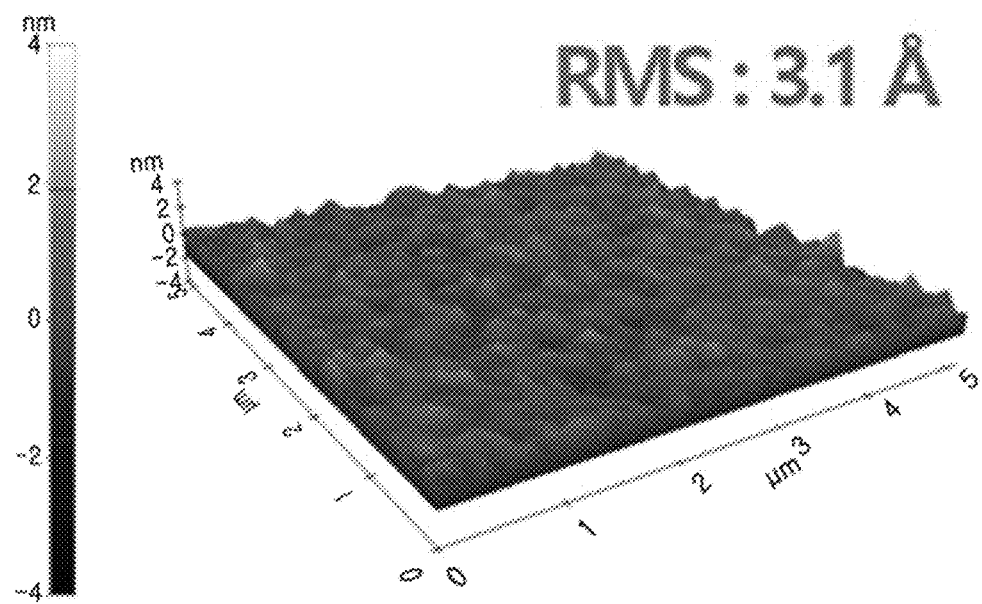

[FIG. 9A]
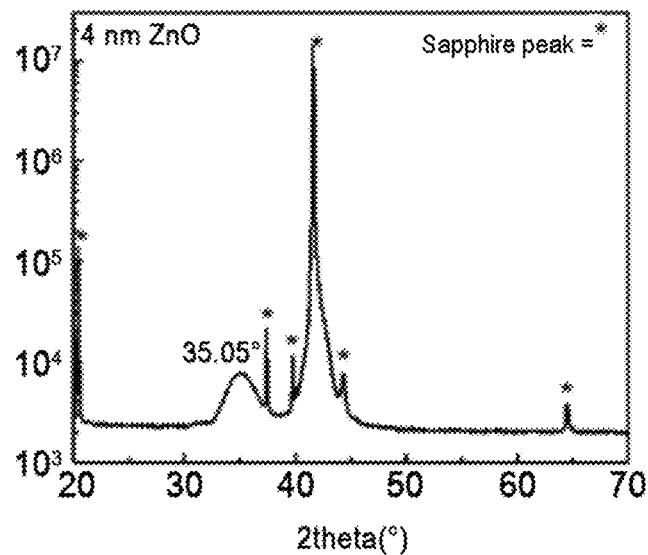
[FIG. 9B]
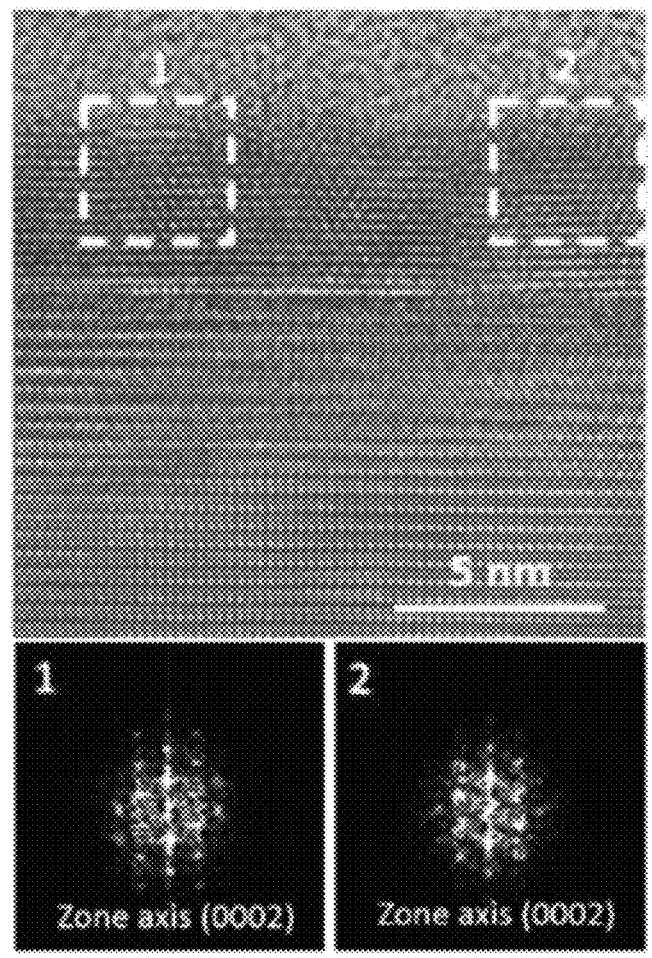

[FIG. 10A]
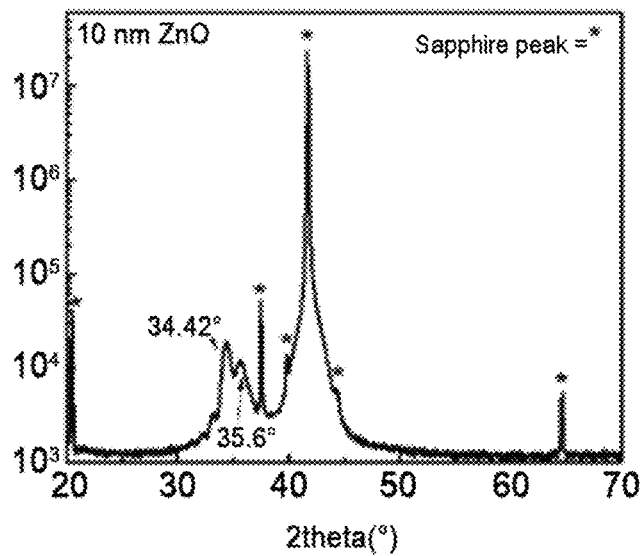
[FIG. 10B]
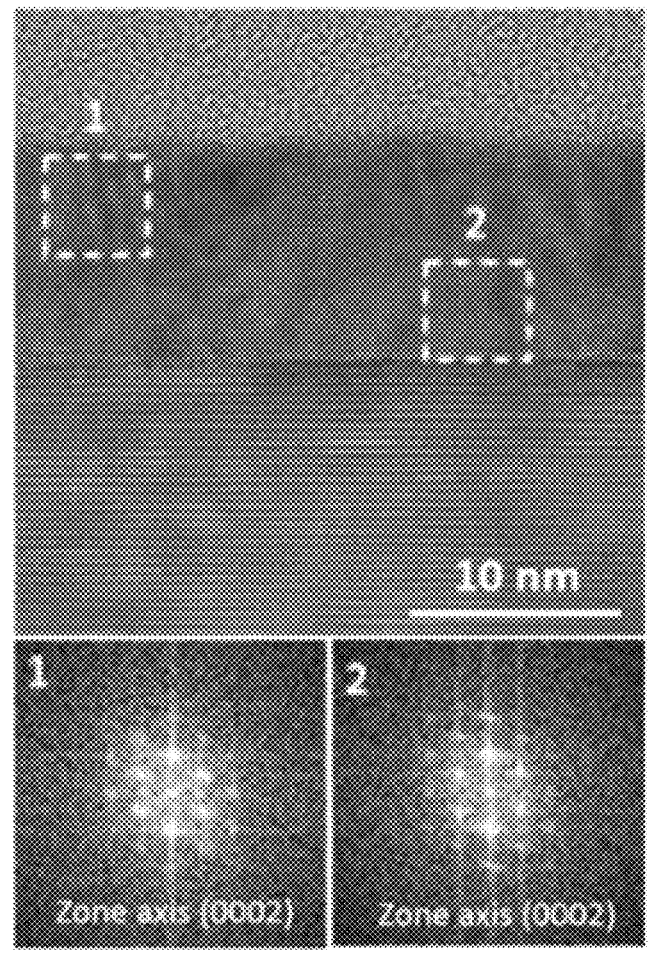

[FIG. 11A]
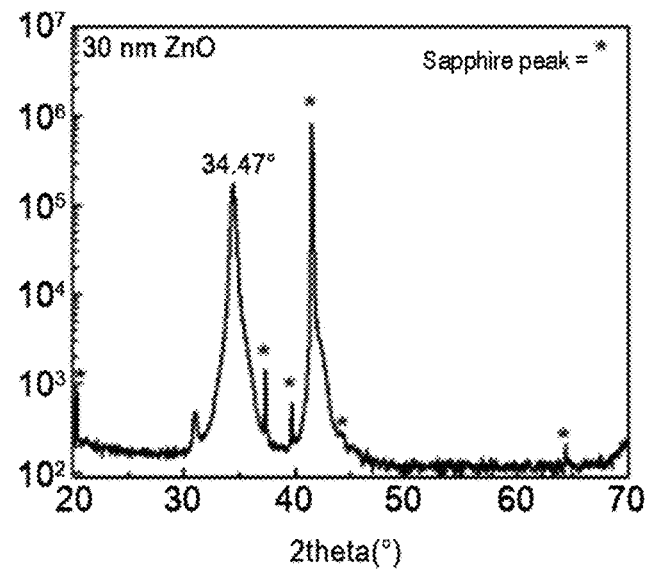
[FIG. 11B]
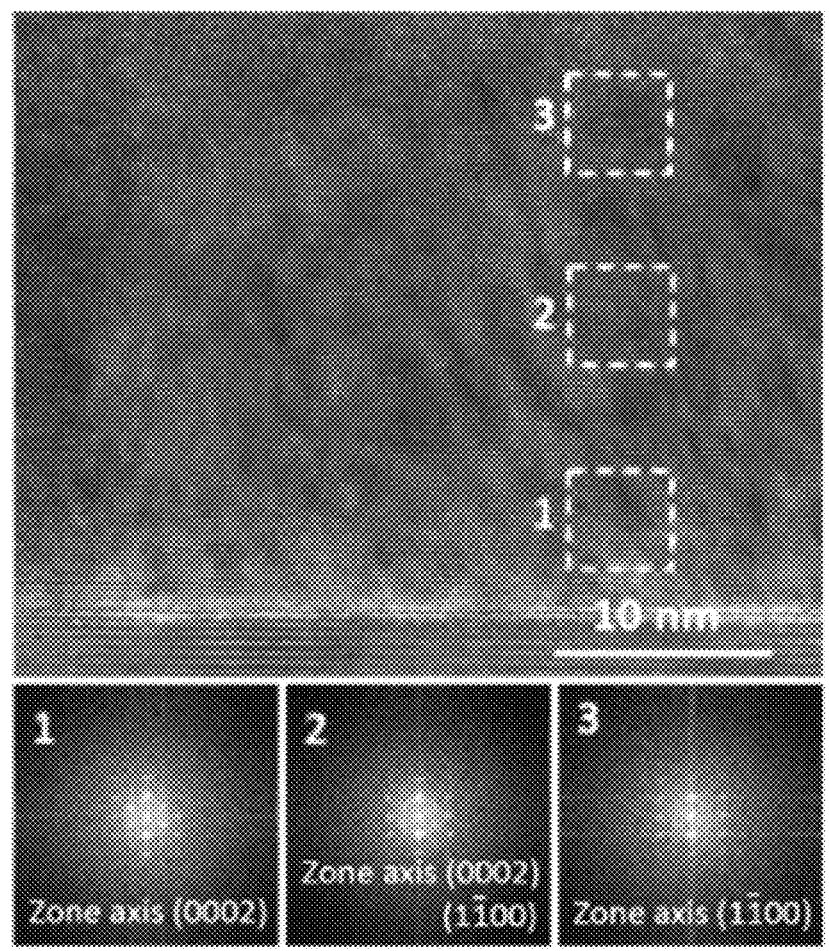

METHOD FOR MANUFACTURING SINGLE-CRYSTAL SEMICONDUCTOR LAYER, STRUCTURE COMPRISING SINGLE-CRYSTAL SEMICONDUCTOR LAYER, AND SEMICONDUCTOR DEVICE COMPRISING STRUCTURE

CROSS REFERENCE TO RELATED APPLICATIONS

This application is a National Stage of International Application No. PCT/KR2019/017268 filed Dec. 9, 2019, claiming priority based on Korean Patent Application No. 10-2018-0158550 filed Dec. 10, 2018 and Korean Application No. 10-2019-0160511 filed Dec. 5, 2019.

TECHNICAL FIELD

The present invention relates to a semiconductor layer and a semiconductor device including the same, and more particularly, to a single crystalline semiconductor layer.

BACKGROUND ART

As a silicon film used as a semiconductor film of a transistor, an amorphous silicon film or a polycrystalline silicon film is used according to purpose. In recent years, research is being conducted on using an oxide semiconductor, which is an example of a material other than silicon, as a channel layer of a transistor. Oxide semiconductors are mainly used for display devices because the oxide semiconductors have excellent transparency.

Research has lately been conducted on using an oxide semiconductor as a channel layer of a transistor (JP Publication 2006-165528). However, oxide semiconductor layers are mostly amorphous layers and are known to be electrically and chemically unstable and have difficulty in exhibiting sufficient field-effect mobility.

DISCLOSURE

Technical Problem

Accordingly, an object of the present invention is to provide a method of manufacturing a single crystalline semiconductor layer which may be grown at a low temperature.

Another object of the present invention is to provide a semiconductor device including a single crystalline semiconductor layer.

The objects of the present invention are not limited to the above-mentioned objects, and other objects not mentioned will be clearly understood by those skilled in the art from the following description.

Technical Solution

One aspect of the present invention provides a method of manufacturing a single crystalline semiconductor layer. The method of manufacturing the single crystalline semiconductor layer includes performing a unit cycle multiple times, wherein the unit cycle includes a metal precursor pressurized dosing operation in which a metal precursor is adsorbed on a surface of a single crystalline substrate by supplying the metal precursor onto the single crystalline substrate while an outlet of a chamber in which the single crystalline substrate is loaded is closed such that a reaction pressure in the chamber is increased; a metal precursor purge operation in which the chamber is purged after the metal precursor pressurized dosing operation; a reactive gas supplying operation in which a reactive gas is supplied into the chamber to cause a reaction of the reactive gas with the metal precursor adsorbed on the single crystalline substrate after the metal precursor purge operation; and a reactive gas purge operation in which the chamber is purged after the reactive gas supplying operation. As a result, the single crystalline semiconductor layer may be formed on the single crystalline substrate.

The single crystalline substrate may be a substrate having a hexagonal crystal structure, and the single crystalline semiconductor layer may be a semiconductor layer having a hexagonal wurtzite structure. The single crystalline semiconductor layer may be a semiconductor layer having a c-plane preferred orientation. The single crystalline substrate may be a c-plane substrate, and a partial region of the single crystalline semiconductor layer may have an m-plane preferred orientation. Specifically, a lower region of the single crystalline semiconductor layer, which is adjacent to the single crystalline substrate, may have a c-plane preferred orientation, and a region of the single crystalline semiconductor layer, which is located above the lower region of the single crystalline semiconductor layer, may have an m-plane preferred orientation.

The metal precursor may be a zinc precursor, the reactive gas may be an oxidant, and the single crystalline semiconductor layer may be a ZnO layer. In another example, the metal precursor may be a precursor of group 13 metal, the reactive gas may be a nitrifying agent, and the single crystalline semiconductor layer may be a group 13 metal nitride layer.

The metal precursor pressurized dosing operation and the metal precursor purge operation may constitute a metal precursor sub-cycle. Before the reactive gas supplying operation, the metal precursor sub-cycle may be performed multiple times. The reactive gas supplying operation may be performed as a reactive gas pressurized dosing operation, which is performed when a reaction pressure in the chamber is increased by supplying the reactive gas with an outlet of the chamber closed. The reactive gas pressurized dosing operation and the reactive gas purge operation may constitute a reactive gas sub-cycle, and the unit cycle may include performing the reactive gas sub-cycle multiple times in succession. A temperature of the chamber may be in the range of 80° C. to 150° C.

One aspect of the present invention provides a method of manufacturing a thin-film transistor (TFT). In a method of manufacturing a TFT including a gate electrode, a gate insulating film, a channel layer, and source and drain electrodes, the channel layer may be formed using the above-described method of manufacturing the single crystalline semiconductor layer.

One aspect of the present invention provides a method of manufacturing a light-emitting diode (LED). The LED includes a buffer layer, a light-emitting structure layer stacked on the buffer layer and having a first-conductive-type semiconductor layer and a second-conductive-type semiconductor layer, a first electrode connected to the first-conductive-type semiconductor layer, and a second electrode connected to the second-conductive-type semiconductor layer. The buffer layer may be formed using the above-described method of manufacturing the single crystalline semiconductor layer.

One aspect of the present invention provides a structure. The structure includes a substrate; and a single crystalline semiconductor layer in which a lower region adjacent to the substrate has a c-plane preferred orientation and a region located above the lower region has an m-plane preferred orientation. The substrate is a substrate having a hexagonal crystal structure and is a c-plane substrate. The single crystalline semiconductor layer may have a thickness of 10 nm to 100 nm.

One aspect of the present invention provides a TFT. The TFT includes a single crystalline substrate; a single crystalline semiconductor layer having a hexagonal wurtzite structure epitaxially grown from the single crystalline substrate; a gate electrode disposed on the single crystalline semiconductor layer; a gate insulating film disposed between the single crystalline semiconductor layer and the gate electrode; and source and drain electrodes electrically connected to both ends of the single crystalline semiconductor layer.

One aspect of the present invention provides an LED. The LED includes a substrate; a buffer layer in which a lower region adjacent to the substrate has a c-plane preferred orientation and a region located above the lower region has an m-plane preferred orientation; a light-emitting structure layer disposed on the buffer layer and including a first-conductive-type semiconductor layer and a second-conductive-type semiconductor layer; a first electrode electrically connected to the first-conductive-type semiconductor layer; and a second electrode electrically connected to the second-conductive-type semiconductor layer.

Advantageous Effects

According to an embodiment of the present invention, a single crystalline semiconductor layer having excellent crystal quality even at a low temperature can be provided.

According to an embodiment of the present invention, a semiconductor device including a single crystalline semiconductor layer can be provided.

However, the effects of the present invention are not limited to the above-mentioned effects, and other effects not mentioned will be clearly understood by those skilled in the art from the following description.

DESCRIPTION OF DRAWINGS

FIG. 1A is a timing diagram showing the injection of a metal precursor gas, a purge gas, and a reactive gas for manufacturing a single crystalline semiconductor layer according to an embodiment of the present invention.

FIG. 1B is a timing diagram showing the injection of a metal precursor gas, a purge gas, and a reactive gas for manufacturing a single crystalline semiconductor layer according to another embodiment of the present invention.

FIG. 2 is a schematic view of a thin film manufacturing apparatus according to an embodiment of the present invention.

FIG. 3 is a cross-sectional view of a structure according to an embodiment of the present invention.

FIG. 4 is a cross-sectional view of a thin-film transistor (TFT) according to an embodiment of the present invention.

FIG. 5 is a cross-sectional view of a light-emitting diode (LED) according to an embodiment of the present invention.

FIG. 6 is a table showing parameters of a unit cycle for manufacturing a zinc oxide thin film according to the present manufacturing example.

FIG. 7A is a graph showing a thickness of a zinc oxide thin film relative to the number of unit cycles according to a manufacturing example of a zinc oxide thin film.

FIG. 7B is an X-ray reflectivity (XRR) graph of a zinc oxide thin film obtained by performing the unit cycle according to the manufacturing example of the zinc oxide thin film multiple times.

FIG. 7C shows atomic force microscope (AFM) surface morphology of a zinc oxide thin film obtained by performing the unit cycle according to the manufacturing example of the zinc oxide thin film multiple times.

FIG. 8A is a graph showing a thickness of a zinc oxide thin film relative to the number of unit cycles according to a comparative example of a zinc oxide thin film.

FIG. 8B is an XRR graph of a zinc oxide thin film obtained by performing the unit cycle according to the comparative example of the zinc oxide thin film multiple times.

FIG. 8C shows AFM surface morphology of a zinc oxide thin film obtained by performing the unit cycle according to the comparative example of the zinc oxide thin film multiple times.

FIGS. 9A, 10A, and 11A are respective x-ray diffraction (XRD) graphs of zinc oxide thin films having thicknesses of 4 nm, 10 nm, and 30 nm which were obtained by performing the unit cycle according to the manufacturing example of the zinc oxide thin film multiple times.

FIGS. 9B, 10B, and 11B respectively show high resolution-transmission electron microscopy (HR-TEM) images and diffraction patterns of the zinc oxide thin films having the thicknesses of 4 nm, 10 nm, and 30 nm which were obtained by performing the unit cycle according to the manufacturing example of the zinc oxide thin film multiple times.

MODES OF THE INVENTION

Hereinafter, exemplary embodiments of the present invention will be described in detail with reference to the accompanying drawings in order to describe the present invention in more detail. However, the invention is not limited to the embodiments described herein and may be embodied in other forms. In the drawings, where a layer is said to be "on" another layer or substrate, it may be formed directly on the other layer or substrate, or a third layer may be interposed therebetween. In the present embodiments, "first," "second," or "third" is not intended to impose any limitation on the components, but should be understood as a term for distinguishing the components.

In the present specification, when it is described as "carbon number X to carbon number Y (Cx-Cy)," it should be construed that the case having the number of carbon atoms corresponding to all integers between carbon number X and carbon number Y is also described.

FIG. 1A is a timing diagram showing the injection of a metal precursor gas, a purge gas, and a reactive gas for manufacturing a single crystalline semiconductor layer according to an embodiment of the present invention. FIG. 1B is a timing diagram showing the injection of a metal precursor gas, a purge gas, and a reactive gas for manufacturing a single crystalline semiconductor layer according to another embodiment of the present invention. FIG. 2 is a schematic view of a thin film manufacturing apparatus according to an embodiment of the present invention.

Referring to FIGS. 1A, 1B, and 2, a substrate S may be loaded onto a stage 102 in a chamber 100 including a gas inlet 120 and a gas outlet 140. The substrate S may be a single crystalline substrate. As an example, the substrate S may be a substrate having a hexagonal crystal structure, specifically a c-plane single crystalline substrate. As an example, the substrate S may be a sapphire substrate and, more specifically, may be a c-plane sapphire substrate.

Before the substrate S is loaded into the chamber 100, the chamber 100 may be heated to a deposition temperature and maintained at the deposition temperature by a controller 150. The deposition temperature may be in the range of 20° C. to 250° C., 50° C. to 200° C., 80° C. to 150° C., 90° C. to 100° C., or 95° C. to 105° C. The gas outlet 140 may be connected to a vacuum pump.

First, by closing all gas control valves 130, 132, and 134 connected to the gas inlet 120 and opening a gas outlet valve 142 connected to the gas outlet 140, the inside of the chamber 100 may enter a vacuum state. Thereafter, while a metal precursor gas control valve 130 is open and the gas outlet valve 142 is closed, a metal precursor gas may be supplied from a metal precursor storage unit 110 into the chamber 100.

A metal precursor may be a zinc precursor or a group 13 metal precursor. The zinc precursor may be, for example, di(C1-C5 alkyl)zinc. di(C1-C5 alkyl)zinc may be diethyl zinc (DEZ). The group 13 metal precursor may be, for example, a gallium precursor, an indium precursor, or an aluminum precursor and may be a tri(C1-C5 alkyl)metal (here, the metal is a group 13 metal). The gallium precursor may be, for example, trimethyl gallium ($Ga(CH_3)_3$) (TMGa). The indium precursor may be, for example, trimethyl indium ($In(CH_3)_3$) (TMIn). The aluminum precursor may be, for example, trimethyl aluminum ($Al(CH_3)_3$) (TMAl).

The metal precursor may be stored in a liquid or solid state in the metal precursor storage unit 110. The metal precursor storage unit 110 may be heated to a temperature below a pyrolysis temperature of the metal precursor, and thus, the metal precursor may be supplied into the chamber 100 with a predetermined vapor pressure. In this case, the supplied metal precursor may be supplied without a carrier gas. Because the metal precursor is supplied with the gas outlet valve 142 closed, the inner pressure of the chamber 100 may be increased while accumulating the metal precursor in the chamber 100. The metal precursor may be supplied into the chamber 100 until the pressure of the chamber 100 reaches a reaction pressure $P_M$ (metal precursor supplying operation $MD_n$). The reaction pressure $P_M$ (i.e., pressure of the metal precursor gas in the chamber) may be in the range of several tens of mTorr to several Torr, specifically, 100 mTorr to 5 Torr, 500 mTorr to 3 Torr, or 700 mTorr to 1.5 Torr.

When the pressure of the chamber 100 reaches the reaction pressure $P_M$, the metal precursor gas control valve 130 may be closed, and the chamber 100 may be sealed for a predetermined time (metal precursor exposure operation $ME_n$). The metal precursor supplying operation $MD_n$ and the metal precursor exposure operation $ME_n$ may be referred to as a metal precursor pressurized dosing operation. However, the metal precursor exposure operation $ME_n$ may be omitted in some cases.

In the metal precursor pressurized dosing operation (i.e., the metal precursor supplying operation $MD_n$ and the metal precursor exposure operation $ME_n$), the metal precursor gas may be deposited on the substrate S or a surface of a layer formed on the substrate S by chemisorption and a self-saturated reaction. Because the chemisorption and the self-saturated reaction of the metal precursor gas occur in a pressurized environment, specifically a pressurized stagnant environment rather than a lamina flow environment, a chemical adsorption rate of the metal precursor gas onto the substrate S or the layer formed on the substrate S or surface coverage of the metal precursor gas may be greatly improved.

Subsequently, the chamber 100 may be purged (metal precursor purge operation $MP_1$). Specifically, by opening a purge gas control valve 132 and the gas outlet valve 142, a purge gas in a purge gas storage unit 112 may flow onto a surface of the substrate S in the chamber 100, and thus, excess metal precursor gas, which is not adsorbed on the surface of the substrate S, and a reaction byproduct, which is generated by a reaction of the metal precursor gas with the surface of the substrate S, may be removed. In this case, the purge gas may be provided as an inert gas, for example, argon (Ar), nitrogen ($N_2$), or a combination thereof.

The metal precursor pressurized dosing operation $MD_n$ and $ME_n$ and a metal precursor purge operation $MP_n$ may constitute a metal precursor sub-cycle $M-SC_n$. The metal precursor sub-cycle $M-SC_n$, may be performed once to multiple times, specifically, once to ten times (n=1 to 10), for example, twice to seven times (n=2 to 7), or three to five times (n=3 to 5). A plurality of metal precursor sub-cycles $M-SC_n$ may constitute a metal precursor unit cycle M-UC. When the metal precursor sub-cycle $M-SC_n$ is performed multiple times ($M-SC_1$, $M-SC_2$, ..., and $M-SC_n$, n≥2), in the embodiment shown in FIG. 1A, the reaction pressure $P_M$ may be substantially the same in the metal precursor pressurized dosing operations $MD_1$, $MD_2$, ..., and $MD_n$ and $ME_1$, $ME_2$, ..., and $ME_n$ (n≥2), whereas, in the embodiment shown in FIG. 1B, the reaction pressure $P_{M1}$, $P_{M2}$, and $P_{Mn}$ may be different in the metal precursor pressure dosing operations $MD_1$, $MD_2$, ..., and $MD_n$ and $ME_1$, $ME_2$, ..., and $ME_n$ (n≥2). Although FIG. 1B illustrates a case in which the reaction pressure $P_{M1}$, $P_{M2}$, and $P_{Mn}$ is gradually increased as the number of metal precursor pressurized dosing operations $MD_1$, $MD_2$, ..., and $MD_n$ and $ME_1$, $ME_2$, ..., and $ME_n$ (n≥2) increases, the present invention is not limited thereto, and the reaction pressure may be gradually reduced.

After the metal precursor unit cycle M-UC is performed, a reactive gas supplying operation $OD_n$ of supplying a reactive gas into the chamber may be performed. The reactive gas may react with the metal precursor adsorbed on the substrate S. The reactive gas may be specifically an oxidant which may oxidize the metal precursor to form a metal oxide unit layer, or nitrifying agent which may nitrify the metal precursor to form a metal nitride unit layer. The oxidant may be $H_2O$, $H_2O_2$, $O_2$, or $O_3$, without being limited thereto. In a specific example, the oxidant may be $H_2O$, and the nitrifying agent may be $NH_3$, without being limited thereto. When the zinc precursor is used as the metal precursor, an oxidant may be used as the reactive gas. When the group 13 metal precursor is used as the metal precursor, a nitrifying agent may be used as the reactive gas.

In an embodiment, while a reactive gas control valve 134 is open and the gas outlet valve 142 is closed, the reactive gas may be supplied from a reactive gas storage unit 114 into the chamber 100. Because the reactive gas is supplied with the gas outlet valve 142 closed, the inner pressure of the chamber 100 may be increased while accumulating the reactive gas in the chamber 100. The reactive gas may be supplied into the chamber 100 until the pressure of the chamber 100 reaches a reaction pressure $P_{OX}$. A reaction pressure $P_{OX}$ (i.e., pressure of the reactive gas in the chamber) may be in the range of 100 mTorr to 10 Torr, specifically, 200 mTorr to 8 Torr, 500 mTorr to 5 Torr, or 700 mTorr to 2 Torr. In an embodiment, the supplied reactive gas may be supplied without a carrier gas. When the reactive gas is $H_2O$ or $H_2O_2$, the reactive gas may be stored in a liquid phase in the reactive gas storage unit 114. The reactive gas storage unit 114 may be heated, and the reactive gas may be supplied into the chamber 100 with a predetermined vapor pressure.

When the pressure of the chamber 100 reaches the reaction pressure $P_{OX}$, the reactive gas control valve 134 may be closed, and the chamber 100 may be sealed for a predetermined time (reactive gas exposure operation $OE_n$). The reactive gas supplying operation $OD_n$ and the reactive gas exposure operation $OE_n$ may be referred to as a reactive gas pressurized dosing operation. However, the reactive gas exposure operation $OE_n$ may be omitted in some cases.

In the reactive gas pressurized dosing operation (i.e., the reactive gas supplying operation $OD_n$ and the reactive gas exposure operation $OE_n$), the reactive gas may react with a metal precursor layer formed on the substrate S and change the metal precursor layer into a semiconductor unit layer, for example, a metal oxide unit layer or a metal nitride unit layer. As an example, the metal oxide unit layer may be a zinc oxide unit layer, and the metal nitride unit layer may be a gallium nitride unit layer. As described above, a reaction of the reactive gas with the metal precursor layer may be performed in a pressurized environment, specifically, a pressurized stagnant environment rather than a lamina flow environment. However, the present invention is not limited thereto, and the reactive gas may be supplied with the gas outlet valve 142 open, and react with the metal precursor layer in a state of formation of a lamina flow in the chamber 100.

Thereafter, the chamber 100 may be purged (reactive gas purge operation $OP_n$). Specifically, by opening the purge gas control valve 132 and the gas outlet valve 142, the purge gas in the purge gas storage unit 112 may flow onto the surface of the substrate S, and thus, excess reactive gas, which did not react with the metal precursor layer, and a reaction product generated by the reaction of the reactive gas with the metal precursor, may be removed. In this case, the purge gas may be provided as an inert gas, for example, argon (Ar), nitrogen ($N_2$), or a combination thereof.

The reactive gas pressurized dosing operation ($OD_n$ and $OE_n$) and the reactive gas purge operation $OP_n$ may constitute a reactive gas sub-cycle $O\text{-}SC_n$. The reactive gas sub-cycle $O\text{-}SC_n$ may be performed once to multiple times, specifically once to ten times (n=1 to 10), for example, twice to seven times (n=2 to 7), or three to five times (n=3 to 5). A plurality of reactive gas sub-cycles $O\text{-}SC_n$ may constitute a reactive gas unit cycle O-UC. When the reactive gas sub-cycle is performed multiple times ($O\text{-}SC_1$, $O\text{-}SC_2$, ..., and $O\text{-}SC_n$, n≥2), in the embodiment shown in FIG. 1A, the reaction pressure $P_{OX}$ may be substantially the same in the reactive gas pressure dosing operations $OD_1$, $OD_2$, ... $OD_n$, $OE_1$, $OE_2$, ..., and $OE_n$ (n≥2), whereas, in the embodiment shown in FIG. 1B, the reaction pressure $P_{OX1}$, $P_{OX2}$, and $P_{OXn}$ may be different in the reactive gas pressure dosing operations $OD_1$, $OD_2$, ... $OD_n$, $OE_1$, $OE_2$, ..., and $OE_n$ (n≥2). Although FIG. 1B illustrates a case in which the reaction pressure $P_{OX1}$, $P_{OX2}$, and $P_{OXn}$ is gradually increased as the number of reactive gas pressurized dosing operations $OD_1$, $OD_2$, ..., $OD_n$, $OE_1$, $OE_2$, ..., and $OE_n$ (n≥2) increases, the present invention is not limited thereto, and the reaction pressure may be gradually reduced.

When one metal precursor unit cycle M-UC and one reactive gas unit cycle O-UC are performed, an obtained thickness of the semiconductor unit layer (i.e., a thickness per unit cycle) may be about 1.7 Å to 3 Å, specifically 1.9 Å to 2.5 Å or 2 Å to 2.3 Å. Thereafter, the metal precursor unit cycle M-UC and the reactive gas unit cycle O-UC may be alternately and repeatedly performed. The number of repetitions may determine a final thickness of a semiconductor layer. Further, the semiconductor layer obtained using the method according to the present embodiment may have a very low surface roughness of several Å (RMS, root mean square), for example, 3 Å or less, further, 2.5 Å or less (e.g., 2 Å to 2.5 Å) and exhibit excellent surface morphology. In addition, the semiconductor layer obtained using the method according to the present embodiment may have a density of 5.1 g/cm³ or more (e.g., 5.2 g/cm³ or 5.3 g/cm³ or more), specifically, 5.2 g/cm³ to 5.5 g/cm³, and exhibit very dense film properties.

Because the metal precursor is adsorbed on the substrate S in a pressured stagnant environment in which at least a reaction pressure is increased, the semiconductor layer formed as described above may be formed with a very great thickness per unit cycle, as compared to a thickness per unit cycle of about 1 Å of a semiconductor layer obtained when a metal precursor is adsorbed using a typical ALD process, that is, in a lamina flow environment rather than a pressurized environment. Further, the semiconductor layer formed as described above may have a low surface roughness and be formed as a dense film.

A semiconductor layer obtained using a method according to the present embodiment may be a single crystalline layer. The single crystalline layer may have a hexagonal crystal structure, specifically a hexagonal wurtzite structure. Further, the single crystalline semiconductor layer may have a c-plane preferred orientation, specifically a (0002)-plane preferred orientation. In another example, a partial region of the single crystalline semiconductor layer may have an m-plane preferred orientation, specifically a (1-100)-plane preferred orientation. Specifically, the single crystalline semiconductor layer may change from a film having the c-plane preferred orientation to a film having the m-plane preferred orientation as a grown thickness increases. In other words, a lower region of the semiconductor layer, which is adjacent to the single crystalline substrate, may have a c-plane preferred orientation, and a region of the semiconductor layer, which is located above the lower portion of the semiconductor layer, may have an m-plane preferred orientation. In one example, when the single crystalline semiconductor layer is a zinc oxide layer, the single crystalline semiconductor layer may have the c-plane preferred orientation at a thickness of about 10 nm or less and have the m-plane preferred orientation at a thickness of about 10 nm or more.

FIG. 3 is a cross-sectional view of a structure according to an embodiment of the present invention.

Referring to FIG. 3, a substrate 10 may be provided. The substrate 10 may be a single crystalline substrate. The single crystalline substrate may be a substrate having a structure having a hexagonal crystal structure, specifically a c-plane single crystalline substrate. As an example, the substrate 10 may be a sapphire substrate, more specifically, a c-plane sapphire substrate. The substrate 10 may be an insulating substrate.

A single crystalline semiconductor layer 20 is disposed on the substrate 10. The single crystalline semiconductor layer 20 may be an epitaxial layer epitaxially grown on the substrate 10 using the same method as described with reference to FIGS. 1A, 1B, and 2. The single crystalline semiconductor layer 20 may have a hexagonal crystal structure, specifically, a hexagonal wurtzite structure. In addition, the single crystalline semiconductor layer 20 may have a c-plane preferred orientation, specifically a (0002)-plane preferred orientation. In another example, a partial region of the single crystalline semiconductor layer 20 may have an m-plane preferred orientation, specifically a (1-100)-plane preferred orientation. Specifically, the single crystalline semiconductor layer 20 may change from a film having the c-plane preferred orientation to a film having the m-plane preferred orientation as a grown thickness increases. In other words, a lower region of the single crystalline semiconductor layer 20, which is adjacent to the single crystalline substrate, may have a c-plane preferred orientation, and a region of the single crystalline semiconductor layer 20, which is located above the lower region of the single crystalline semiconductor layer 20, may have an m-plane preferred orientation. In one example, when the single crystalline semiconductor layer 20 is a zinc oxide layer, the single crystalline semiconductor layer 20 may have the c-plane preferred orientation at a thickness of about 10 nm or less and have the m-plane preferred orientation at a thickness of about 10 nm or more. The single crystalline semiconductor layer 20 may have a thickness of 1 nm to 1000 nm, for example, 2 nm to 100 nm, and, specifically 3 nm to 50 nm.

FIG. 4 is a cross-sectional view of a thin-film transistor (TFT) according to an embodiment of the present invention.

Referring to FIG. 4, the single crystalline semiconductor layer 20 described with reference to FIG. 3 may be patterned using a photolithography process, and a gate insulating film 30 may be then formed on the patterned single crystalline semiconductor layer 20. The gate insulating film 30 may be a silicon oxide film, a silicon oxynitride film, an aluminum oxide film, an aluminum oxynitride film, or a composite film thereof. The gate insulating film 30 may be formed using an atomic layer deposition (ALD) method and, as an example, may be an aluminum oxide film. A gate electrode 40 overlapping the single crystalline semiconductor layer 20 may be formed on the gate insulating film 30. The gate electrode 40 may be formed using aluminum (Al), chromium (Cr), copper (Cu), tantalum (Ta), titanium (Ti), molybdenum (Mo), tungsten (W), or an alloy thereof. An interlayer insulating film 35 may be formed on the gate electrode 40, and contact holes respectively exposing both ends of the patterned single crystalline semiconductor layer 20 may be then formed in the interlayer insulating film 35. Thereafter, source and drain electrodes 50S and 50D may be formed in the contact holes. The source electrode 50S and the drain electrode 50D may be formed using at least one metal of aluminum (Al), neodymium (Nd), silver (Ag), chromium (Cr), titanium (Ti), tantalum (Ta), and molybdenum (Mo), or an alloy thereof, or may be formed using a metal oxide conductive film, for example, indium tin oxide (ITO).

As described above, the TFT including the single crystalline semiconductor layer 20 as a channel layer may exhibit excellent electron mobility.

FIG. 5 is a cross-sectional view of a light-emitting diode (LED) according to an embodiment of the present invention.

Referring to FIG. 5, a substrate 10 on which the single crystalline semiconductor layer 20 described with reference to FIG. 3 is formed may be provided. In this case, the single crystalline semiconductor layer 20 may be referred to as a buffer layer 20. As described with reference to FIG. 3, an uppermost surface of the buffer layer 20 may have a c-plane preferred orientation or an m-plane preferred orientation.

A light-emitting structure layer 60 may be formed on the buffer layer 20. The light-emitting structure layer 60 may include a first-conductive-type semiconductor layer 61 and a second-conductive-type semiconductor layer 63 that are stacked sequentially. Furthermore, the light-emitting structure layer 60 may further include an active layer 62 between the first-conductive-type semiconductor layer 61 and the second-conductive-type semiconductor layer 63.

The first-conductive-type semiconductor layer 61 may be an oxide-based semiconductor layer (e.g., a zinc oxide (ZnO) layer) or a nitride-based semiconductor layer (e.g., an $In_xAl_yGa_{1-x-y}N$ layer ($0 \leq x \leq 1$, $0 \leq y \leq 1$, and $0 \leq x+y \leq 1$)). The first-conductive-type semiconductor layer 61 may be a layer doped with an n-type dopant or an undoped layer that exhibits an n-type. When the first-conductive-type semiconductor layer 61 is the nitride-based semiconductor layer, the n-type dopant may be silicon (Si).

The second-conductive-type semiconductor layer 63 may be an oxide-based semiconductor layer (e.g., a ZnO layer) or a nitride-based semiconductor layer (e.g., an $In_xAl_yGa_{1-x-y}N$ layer ($0 \leq x \leq 1$, $0 \leq y \leq 1$, and $0 \leq x+y \leq 1$)). The second-conductive-type semiconductor layer 63 may be a layer doped with a p-type dopant. When the second-conductive-type semiconductor layer 63 is the nitride-based semiconductor layer, the p-type dopant may be magnesium (Mg). When the second-conductive-type semiconductor layer 63 is the ZnO layer, the p-type dopant may be antimony (Sb).

The active layer 62 may have a single quantum well (SQW) structure or a multiple quantum well (MQW) structure. As an example, the active layer 62 may have an MQW structure which is a multilayered structure of InGaN/GaN, AlGaN/(In)GaN, or InAlGaN/(In)GaN. In another example, the active layer 62 may have an MQW structure which is a multilayered structure of ZnO/ZnMgO.

Unlike the buffer layer 20 that is formed using a pressurized atomic layer deposition process described with reference to FIGS. 1A, 1B, and 2, the light-emitting structure layer 60 may be epitaxially formed on the buffer layer 20 using various deposition or growth processes including a metal organic chemical vapor deposition (MOCVD) process, a CVD process, a plasma-enhanced CVD (PECVD) process, a molecular beam epitaxy (MBE) process, a hydride vapor phase epitaxy (HVPE) process, and the like.

In this case, when the uppermost surface of the buffer layer 20 has the c-plane preferred orientation, the light-emitting structure layer 60 may also be formed to have a c-plane preferred orientation. When the uppermost surface of the buffer layer 20 has the m-plane preferred orientation, the light-emitting structure layer 60 may also be formed to have an m-plane preferred orientation. When the light-emitting structure layer 60 is grown to have the c-plane preferred orientation, because gallium (Ga) atoms and nitrogen (N) atoms, as an example of heteroatoms, are located at upper and lower portions in a c-axis direction, spontaneous polarization occurs, thereby generating an electrostatic field. As a result, the distribution of electrons and holes may be distorted, and thus, there may be a limitation to the improvement of quantum efficiency. In another case, when the light-emitting structure layer 60 is grown to have the m-plane preferred orientation, polarization hardly occurs, and thus, quantum efficiency may be greatly improved.

Thereafter, the first-conductive-type semiconductor layer 61 may be exposed on a side of a mesa region by mesa-etching a partial region of the light-emitting structure layer 60. A first electrode 71 and a second electrode 72 may be formed to be respectively connected to the exposed first-conductive-type semiconductor layer 61 and the second-conductive-type semiconductor layer 63, which is an upper portion of the mesa region.

Experimental examples will now be presented to aid the understanding of the present invention, but they are intended merely to be illustrative, and the present invention is not limited by the following experimental examples.

Manufacturing Example of Zinc Oxide Thin Film

FIG. 6 is a table showing parameters of a unit cycle for manufacturing a zinc oxide thin film according to the present manufacturing example.

A sapphire substrate was loaded into a chamber including a gas inlet and a gas outlet, and the chamber was heated to a temperature of 100° C. While the gas outlet was closed, diethylzinc (DEZ) was supplied as a zine precursor onto the substrate through the gas inlet (metal precursor supplying operation). In this case, the zinc precursor was supplied without a carrier gas and supplied until the inner pressure of the chamber reached 1 Torr. Subsequently, the zinc precursor was reacted for 3 seconds on a surface of the substrate while maintaining the chamber under a pressure of 1 Torr by closing the gas inlet (metal precursor exposure operation). Thereafter, argon was supplied as a purge gas through the gas inlet for 15 seconds with both the gas inlet and the gas outlet open, and thus, a reaction byproduct and a residual reactive gas was purged (metal precursor purge operation). The zinc precursor supplying operation, the zinc precursor exposure operation, and the zinc precursor purge operation constitute a zinc precursor sub-cycle, and the zinc precursor sub-cycle was repeated four times to form a zinc atomic layer.

Afterwards, while the gas outlet was closed, $H_2O$ was supplied as a reactive gas onto the zinc atomic layer through the gas inlet. In this case, the reactive gas was supplied without a carrier gas and supplied until the inner pressure of the chamber reached 1 Torr (reactive gas supplying operation). Subsequently, $H_2O$ was reacted for 3 seconds on a surface of the zinc atomic layer while maintaining the chamber under a pressure of 1 Torr by closing the gas inlet (reactive gas exposure operation). Thereafter, argon was supplied as a purge gas through the gas inlet for 25 seconds with both the gas inlet and the gas outlet open, and thus, a reaction byproduct and a residual reactive gas was purged (reactive gas purge operation). The reactive gas supplying operation, the reactive gas exposure operation, and the reactive gas purge operation may constitute a reactive gas sub-cycle, and the reactive gas sub-cycle was repeatedly performed four times, and thus, an oxygen atomic layer was formed on the zinc atomic layer. Thus, a zinc oxide unit layer was formed. The four zinc precursor sub-cycles and the four reactive gas sub-cycles may constitute the unit cycle for manufacturing the zinc oxide thin film.

Comparative Example of Zinc Oxide Thin Film

A sapphire substrate was loaded into a chamber including a gas inlet and a gas outlet, and the chamber was heated to a temperature of 100° C. A gas mixture of DEZ serving as a zinc precursor and argon serving as a carrier gas was supplied for 2 seconds with the gas outlet of the chamber open, and thus, the gas mixture of DEZ and argon was maintained in a lamina flow state in the chamber. In this case, a partial pressure of DEZ was 20 mTorr. Afterwards, a reaction byproduct and a residual reactive gas were purged by supplying argon as a purge gas for 20 seconds. A gas mixture of $H_2O$ serving as a reactive gas and argon as a carrier gas was supplied for 2 seconds while being maintained in a lamina flow state. In this case, a partial pressure of $H_2O$ was 20 mTorr. Thereafter, a reaction byproduct and a residual reactive gas were purged by supplying argon as a purge gas for 40 seconds.

FIG. 7A is a graph showing a thickness of a zinc oxide thin film relative to the number of unit cycles according to a manufacturing example of a zinc oxide thin film. FIG. 8A is a graph showing a thickness of a zinc oxide thin film relative to the number of unit cycles according to a comparative example of a zinc oxide thin film.

Referring to FIGS. 7A and 8A, it can be seen that zinc oxide film according to the manufacturing example of the zinc oxide thin film was formed to have a thickness of about 2.1 Å per unit cycle, and zinc oxide film according to the comparative example of the zinc oxide thin film was formed to have a thickness of about 1.5 Å per unit cycle. From the results, it can be seen that the thickness of zinc oxide obtained per unit cycle according to the manufacturing example of the zinc oxide thin film is greater than that of zinc oxide obtained per unit cycle according to the comparative example of the zinc oxide thin film.

FIG. 7B is an X-ray reflectivity (XRR) graph of a zinc oxide thin film obtained by performing the unit cycle according to the manufacturing example of the zinc oxide thin film multiple times. FIG. 8B is an XRR graph of a zinc oxide thin film obtained by performing the unit cycle according to the comparative example of the zinc oxide thin film multiple times. Here, each of the zinc oxide thin film according to the manufacturing example of the zinc oxide thin film and the zinc oxide thin film according to the comparative example of the zinc oxide thin film was formed to have a thickness of about 15 nm.

Referring to FIGS. 7B and 8B, it can be seen that the zinc oxide thin film according to the manufacturing example of the zinc oxide thin film was formed at a density of about 5.304 $g/cm^3$, and the zinc oxide thin film according to the comparative example of the zinc oxide thin film was formed at a density of about 5.096 $g/cm^3$. From the results, it can be seen that the density of the zinc oxide thin film according to the manufacturing example of the zinc oxide thin film is higher than that of the zinc oxide thin film according to the comparative example of the zinc oxide thin film FIG. 7C shows atomic force microscope (AFM) surface morphology of a zinc oxide thin film obtained by performing the unit cycle according to the manufacturing example of the zinc oxide thin film multiple times. FIG. 8C shows AFM surface morphology of a zinc oxide thin film obtained by performing the unit cycle according to the comparative example of the zinc oxide thin film multiple times. Here, each of the zinc oxide thin film according to the manufacturing example of the zinc oxide thin film and the zinc oxide thin film according to the comparative example of the zinc oxide thin film was formed to have a thickness of about 20 nm.

Referring to FIGS. 7C and 8C, it can be seen that the zinc oxide thin film according to the manufacturing example of the zinc oxide thin film exhibited an RMS roughness of about 2.4 Å, and the zinc oxide thin film according to the comparative example of the zinc oxide thin film exhibited an RMS roughness of about 3.1 Å. From the results, it can be seen that a surface of the zinc oxide thin film according to the manufacturing example of the zinc oxide thin film has a very low roughness.

FIGS. 9A, 10A, and 11A are respective x-ray diffraction (XRD) graphs of zinc oxide thin films having thicknesses of 4 nm, 10 nm, and 30 nm which were obtained by performing the unit cycle according to the manufacturing example of the zinc oxide thin film multiple times. FIGS. 9B, 10B, and 11B respectively show high resolution-transmission electron microscopy (HR-TEM) images and diffraction patterns of the zinc oxide thin films having the thicknesses of 4 nm, 10 nm, and 30 nm which were obtained by performing the unit cycle according to the manufacturing example of the zinc oxide thin film multiple times. In each of FIGS. 9B, 10B, and 11B, each of the diffraction patterns is a diffraction pattern of a region indicated in a TEM image of the same drawing.

Referring to FIGS. 9A, 10A, and 11A, the zinc oxide thin film having the thickness of 4 nm provides a peak, which has a center at 35.05° and a full width at half-maximum (FWHM) of 2.2°, and the zinc oxide thin film having the thickness of 10 nm provides a peak obtained by combining a peak, which has a center at 34.42° and an FWHM of 0.79°, with a peak having a center at 35.6°. The zinc oxide thin film having the thickness of 30 nm provides a peak, which has a center at 34.47° and an FWHM of 0.42°. From these results, it can be seen that the zinc oxide thin film according to the manufacturing example of the zinc oxide thin film has excellent crystallinity.

Referring to FIGS. 9B, 10B, and 11B, as crystal structures are observed in the HR-TEM images, it can be seen that the zinc oxide thin films are formed as crystalline thin films.

Referring again to FIGS. 9B and 10B, as (0002) planes are observed in the diffraction patterns, it can be seen that crystals of the zinc oxide thin films having a thickness of 10 nm or less are preferentially oriented in a direction.

Referring again to FIG. 11B, only a (0002) plane (c-plane) was observed in a diffraction pattern 1 of a region having a thickness of 10 nm or less from a surface of a substrate, both a (0002) plane and a (1-100) plane (m-plane) were observed in a diffraction pattern 2 of a region having a thickness of more than 10 nm from the surface of the substrate, and only a (1-100) plane was observed in a diffraction pattern 3 of a region having a thickness of 20 nm or more from the surface of the substrate. From these results, it can be seen that the zinc oxide semiconductor layer changes from a film having a c-plane preferred orientation to a film having an m-plane preferred orientation as a grown thickness increases.

In the above, the present invention has been described in detail with reference to the exemplary embodiments, but the present invention is not limited to the above embodiments, and various modifications and changes by those skilled in the art are possible within the spirit and scope of the present invention.

The invention claimed is:

1. A method of manufacturing a single crystalline semiconductor layer, comprising:
performing a unit cycle multiple times to form the single crystalline semiconductor layer on a single crystalline substrate,
wherein the unit cycle includes the steps of:
a metal precursor pressurized dosing operation in which a metal precursor is adsorbed on a surface of the single crystalline substrate by supplying the metal precursor onto the single crystalline substrate while an outlet of a chamber in which the single crystalline substrate is loaded is closed such that a reaction pressure in the chamber is increased;
a metal precursor purge operation in which the chamber is purged after the metal precursor pressurized dosing operation;
a reactive gas supplying operation in which a reactive gas is supplied into the chamber to cause a reaction of the reactive gas with the metal precursor adsorbed on the single crystalline substrate after the metal precursor purge operation; and
a reactive gas purge operation in which the chamber is purged after the reactive gas supplying operation,
wherein the single crystalline substrate is a substrate having a hexagonal crystal structure, and the single crystalline semiconductor layer is a semiconductor layer having a hexagonal wurtzite structure.

2. The method of claim 1, wherein the single crystalline semiconductor layer is a semiconductor layer having a c-plane preferred orientation.

3. The method of claim 1, wherein the single crystalline substrate is a c-plane substrate, and a partial region of the single crystalline semiconductor layer has an m-plane preferred orientation.

4. The method of claim 3, wherein a lower region of the single crystalline semiconductor layer, which is adjacent to the single crystalline substrate, has a c-plane preferred orientation, and a region of the single crystalline semiconductor layer, which is located above the lower region of the single crystalline semiconductor layer, has an m-plane preferred orientation.

5. The method of claim 1, wherein the metal precursor is a zinc precursor, the reactive gas is an oxidant, and the single crystalline semiconductor layer is a ZnO layer.

6. The method of claim 1, wherein the metal precursor is a precursor of group 13 metal, the reactive gas is a nitrifying agent, and the single crystalline semiconductor layer is a group 13 metal nitride layer.

7. The method of claim 1, wherein the metal precursor pressurized dosing operation and the metal precursor purge operation constitute a metal precursor sub-cycle, and the metal precursor sub-cycle is performed multiple times before the reactive gas supplying operation.

8. The method of claim 1, wherein the reactive gas supplying operation is performed as a reactive gas pressurized dosing operation, which is performed in a state where a reaction pressure in the chamber is increased by supplying the reactive gas with an outlet of the chamber closed.

9. The method of claim 8, wherein the reactive gas pressurized dosing operation and the reactive gas purge operation constitute a reactive gas sub-cycle, and the unit cycle includes performing the reactive gas sub-cycle multiple times in succession.

10. The method of claim 1, wherein a temperature of the chamber may be in the range of 80° C. to 150° C.

11. A structure comprising:
a substrate; and
a single crystalline semiconductor layer in which a lower region adjacent to the substrate has a c-plane preferred orientation and a region located above the lower region has an m-plane preferred orientation.

12. The structure of claim 11, wherein the substrate is a substrate having a hexagonal crystal structure and is a c-plane substrate.

13. The structure of claim 11, wherein the single crystalline semiconductor layer has a thickness of 10 nm to 100 nm.

14. A thin film transistor comprising:
a substrate;
a single crystalline semiconductor layer in which a lower region adjacent to the substrate has a c-plane preferred orientation and a region located above the lower region has an m-plane preferred orientation;
a gate electrode disposed on the single crystalline semiconductor layer;
a gate insulating film disposed between the single crystalline semiconductor layer and the gate electrode; and
source and drain electrodes electrically connected to both ends of the single crystalline semiconductor layer.

15. A light emitting diode (LED) comprising:
a substrate;
a buffer layer in which a lower region adjacent to the substrate has a c-plane preferred orientation and a region located above the lower region has an m-plane preferred orientation;
a light-emitting structure layer disposed on the buffer layer and including a first-conductive-type semiconductor layer and a second-conductive-type semiconductor layer;
a first electrode electrically connected to the first-conductive-type semiconductor layer; and
a second electrode electrically connected to the second-conductive-type semiconductor layer.

* * * * *